United States Patent [19]
Kumagai et al.

[11] Patent Number: 5,922,213
[45] Date of Patent: Jul. 13, 1999

[54] METHOD FOR THE MANUFACTURE OF ORNAMENTAL SILICON ARTICLES

[75] Inventors: Hideo Kumagai, Hiratsuka; Kenzo Fujinuki, Kanagawa-ken; Itaru Imai, Atsugi, all of Japan

[73] Assignee: Komatsu Electronic Metals Co., Ltd., Kanagawa, Japan

[21] Appl. No.: 08/750,946

[22] PCT Filed: Aug. 1, 1994

[86] PCT No.: PCT/JP94/01265

§ 371 Date: Jan. 22, 1997

§ 102(e) Date: Jan. 22, 1997

[87] PCT Pub. No.: WO96/04412

PCT Pub. Date: Feb. 15, 1996

[51] Int. Cl.$^6$ .......................... C30B 29/06; C30B 33/02; C04B 41/00

[52] U.S. Cl. ................ 216/2; 216/28; 427/255; 427/309

[58] Field of Search .................. 216/2, 28, 99; 427/255, 309

[56] References Cited

U.S. PATENT DOCUMENTS 4,055,458 10/1977 Niederprum et al. ................. 156/663
5,409,569 4/1995 Seki et al. ................. 156/662
5,677,783 10/1997 Bloom et al. ........................ 359/224

FOREIGN PATENT DOCUMENTS 60-13599 1/1985 Japan .
339102 2/1991 Japan .

*Primary Examiner*—John M. Ford
*Assistant Examiner*—Pavanaram K Sripada
*Attorney, Agent, or Firm*—Abelman, Frayne & Schwab

[57] ABSTRACT

The mirror-finished silicon surface is brought for pre-processing into contact with the hydrofluoric acid solution, it is NH cleansed, and then it is filmed by oxidation. Otherwise, the silicon surface not mirror-finished is brought for pre-processing into contact with the hydrofluoric acid solution, it is subject to an alkali etching {by a solution of $KOH:H_2O$ base, $NaOH:H_2O$ base, $NH_4OH:H_2O$ base, or $[NH_2(CH_2)_2NH_2]:H_2O:[C_6H_4(OH)_2]$base}, it is NH cleansed by the solution of ($NH_4OH:H_2O_2$ base or $NH_4OH:H_2O_2:H_2O$ base), and then it is filmed by oxidation. In such manufacturing methods the ornamental silicon articles may be processed to their final shape thereafter effecting an oxidation filming. Thus, without using a coloring agent the silicon surface is colored to provide ornamental silicon articles having excellent ornamental properties.

20 Claims, 8 Drawing Sheets

METHOD FOR THE MANUFACTURE OF ORNAMENTAL SILICON ARTICLES

TECHNICAL FIELD

This invention is to provide ornamental silicon articles having colorfulness, durability, novelty and applicability by treating a monocrystalline or a polycrystalline body of silicon, which is mirror-finished or not mirror-finished, according to the method of the invention thereby forming an oxidized film onto the silicon.

BACKGROUND TECHNOLOGY

As substitutes for pearls, noble metals and jewels there are conventionally known such as those in which the surfaces of base metals are colored or plated with other materials or synthetic resins are colored. Particularly, these days, materials manufactured in the field of high technology, such as mirror silicon plates, are used for ornamental parts of tiepins.

In the case of metals or silicon problems do not take occur if the unvarnished materials themselves are used, but if colored materials are used the coloring agent is likely to released thereby presenting a problem for durability. Further, as new jewel imitation it was difficult to obtain it having excellent ornamental properties such as in color, profoundness in color, durability, and gloss and shine. As ornamental silicon articles there are known such ones that in processing silicon as ornamental articles the surface of silicon is provided with an oxidized layer (Patent Kokai No. 3-39102) or with a silicon compound layer permeable but inert to visible rays (Patent Kokai No. 60-13599).

DISCLOSURE OF THE INVENTION

The present invention provides a method for the menufacture of silicon for ornamental articles having excellent ornamental properties by coloring the surface of silicon without using coloring agents. The method is characterized in that a starting material possessing a mirror-finished surface of silicon is pre-treated being brought into contact with a solution of hydrofluoric acid, NH cleansed with a solution of $NH_4OH:H_2O_2$ base or $NH_4OH:H_2O_2$ base and then filmed by oxidation, or the non-mirror-finished surface of silicon is pre-treated being brought into contact with a solution of hydrofluoric acid, subjected to an alkali etching with a solution of $KOH:H_2O$ base, $HaOH:H_2O$ base, $NH_4OH:H_2O$ base or $[NH_2(CH_2)_2 NH_2]:H_2O:[C_6H_4(OH)_2]$ base, then NH cleansed, and finally filmed by oxidation. In the present method it will also be satisfactory that the silicon for ornamental articles is processed to its final shape and thereafter it is filmed by oxidation.

THE BEST MODE FOR CARRYING OUT THE INVENTION

It is conventionally known that owing to the presence of an oxidized film on the surface of silicon the color exhibited by said oxidized film varies according to the thickness of the film. (Refer to Fundamentals of Silicon Integrated Device Technology, edited by R. M. Burger and R. P. Donovan). The film described in this literature is an electrically protective film of a device, which is formed by an oxidized film of semiconductor wafers, and said film is the one researched for the inspection of thickness by eyes. The inventors of this invention have made extensive studies for many years to develop ornamental silicon articles having spherical and curved surfaces. This technology is described in Patent Kokai No. Hei 4-122203. However, the inventors have found that even silicon articles having a plane present a noble elegance when used as ornamental articles.

Figure 8A:
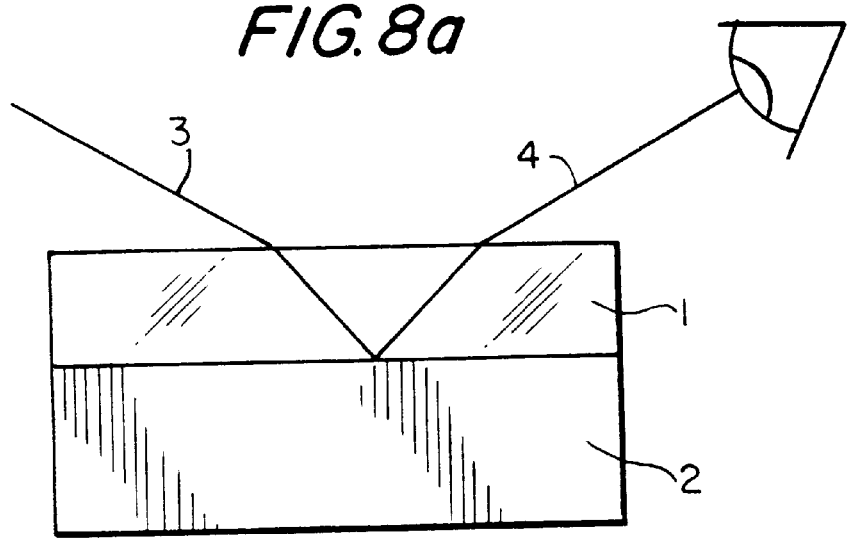
FIGS. 8(a) and 8(b) are views illustrating the coloring principle of one example of an ornamental silicon article according to the present method.
Figure 8B:
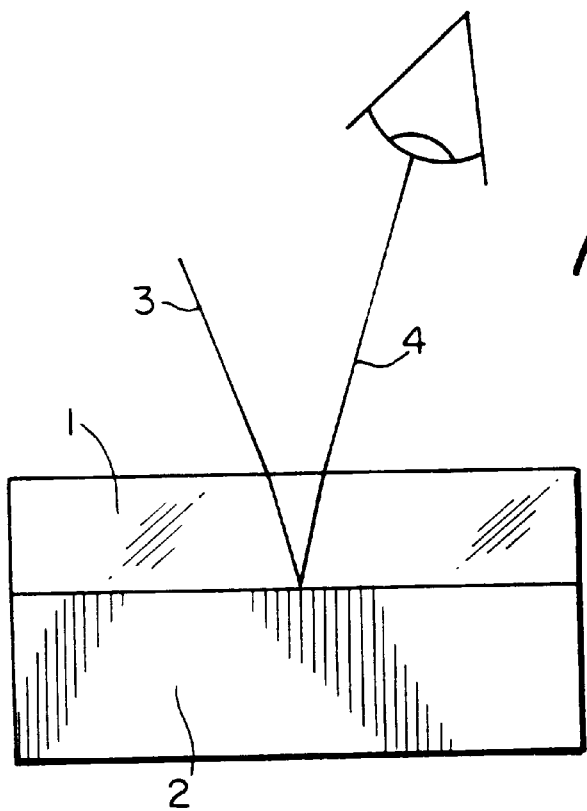

The oxidized film uniformly formed on a silicon plane varies in its virtual film thickness as shown in FIG. 8 depending on its observing direction. It is thus considered that the color produced by the difference of film thickness as described in said literature changes variously depending on its observing direction, and that even a plane becomes to exhibit an appearance having beautiful, highly ornamental properties. It is further considered that particularly the ornamental silicon articles formed with cut faces have different color tones viewed from respective faces and gradually change in color depending on their observing directions, so that they shine brilliantly.

Figure 4A:
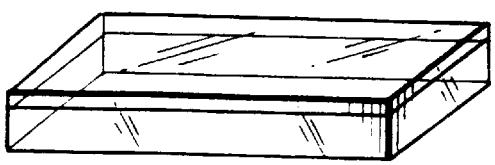
FIGS. 4(a) to 4(f) are views illustrating processing examples of ornamental silicon articles according to the present method.
Figure 4B:
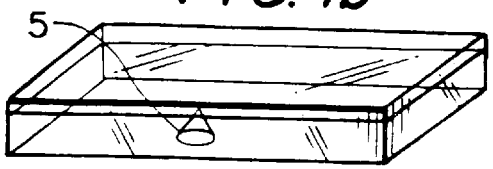
Figure 4C:
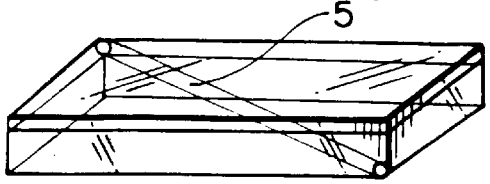
Figure 4D:
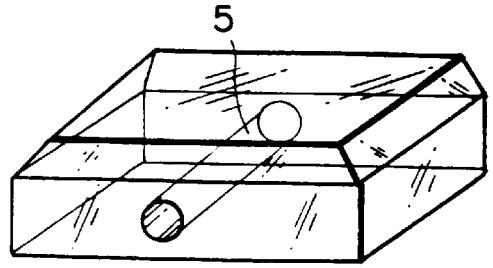
Figure 4E:
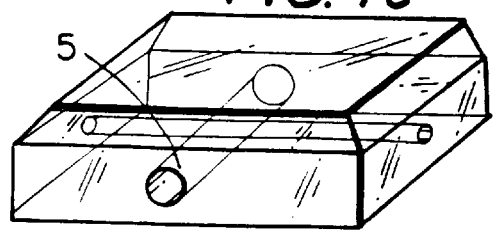
Figure 4F:
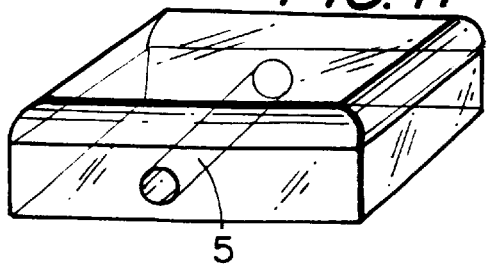

FIGS. 4(a) to 4(f) show processing examples of ornamental silicon articles according to the present invention. FIG. 4(a) shows a plate-like ornamental silicon article. One surface thereof can be fixed with other ornamental articles by an adhesive or the like. FIG. 4(b) shows a hole (5) of a suitable depth, which is provided in the plate surface of FIG. 4(a), and the plate can be screwed with the base bed or the like. FIG. 4(c) to FIG. 4(f) show examples which have a through hole (5), and they can be applied for necklaces or broaches by linking a great number of them in series.

The invention will now be described, by way of Examples, with reference to the accompanying drawings.

EXAMPLE 1

Figure 1A:
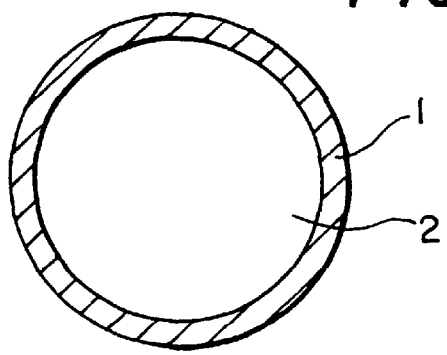
FIG. 1(a) is a sectional view of a spherical silicon piece manufactured according to the method of the present invention.
Figure 10A:
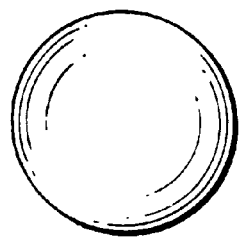
FIGS. 10(a) to 10(g) are examples where the spherical silicon piece shown in FIG. 1(a) is applied with various processings.
Figure 10E:
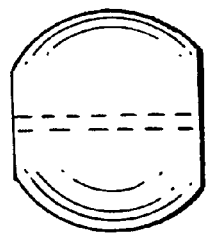
Figure 10B:
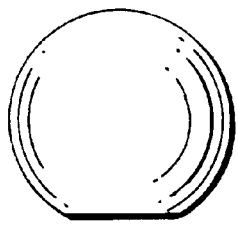
Figure 10F:
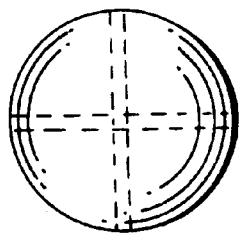
Figure 10C:
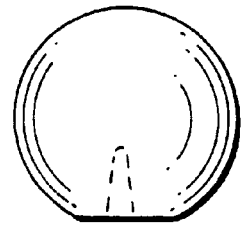
Figure 10G:
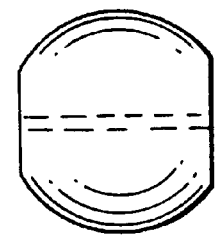
Figure 10D:
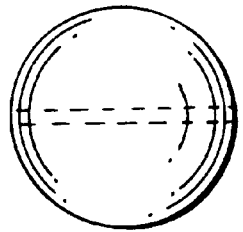

The first invention will be described by way of one Example. This Example is characterized by the introduction of hydrofluoric acid processing steps on mirror suface of monocrystal. That is, firstly, a number of plates of 15 mm thick were cut by slicer out of a monocrystalline ingot of silicon, the plates were cut into 600 to 700 die-like elements, being cut by cutter each in 15 mm×15 mm piece, and they were processed to spherical pieces having 10 mm diameter by grinding them by grinder. Secondly, the spherical pieces were immersed into an etching solution [HF : $HNO_3$=1:5 (Wt %)] thereby subjecting them to a mirror etching processing. Thirdly, said spherical pieces were immersed for further processing for 20 minutes into a solution (at 25° C.) of 50 Wt % hydrofluoric acid concentration. Based on each piece processed as mentioned above as starting material, silicon for ornamental articles was manufactured following the undermentioned steps. Said pieces were separated into 6 groups, each consisting of 100 pieces, and they were placed upon a quartz boat. To obtain desired, oxidized film colors, the respective groups of the pieces were filmed by oxidation by an oxidizing furnace in response to their oxidation processing periods of time shown in Table A. The processing conditions in Nos. 1 to 6 are the same excepting the time. As a result, there were obtained articles having the colors as shown in sample Nos. 1 to 6 of Table 1. The appearance of the silicon for ornamental articles exhibited in its surface a mirror face elegance slightly misty. This example is shown in FIG. 1(a). The reference numeral (1) designates an oxidized film of silicon, and (2) silicon. Further, FIG. 1 and FIG. 10(a) show the same example. FIG. 10(b) shows an example where part of the FIG. 10(a) piece was cut flat, while FIG. 10(c) shows an example where the FIG. 10(a) piece was bored with a pin hole. On the other hand, FIGS. 10(d) to 10(g) show examples where the respective pieces were bored with through holes respectively thereby to be processed for necklaces or the like.

TABLE A

| Item | Conditions |
| --- | --- |
| Oxidation temperature | 1085° C. |
| Oxygen flow rate | 50 cc/min. (Wet) |
| Substitution gas | $N_2$ 20 l/min. |
| Oxidation periods of time | No. 1, 7, 13, 19, 25, 31 . . . 8 min & 30 sec |
|  | No. 2, 8, 14, 20, 26, 32 . . . 9 min |
|  | No. 3, 9, 15, 21, 27, 33 . . . 9 min & 30 sec |
|  | No. 4, 10, 16, 22, 28, 24 . . . 16 min & 15 sec |
|  | No. 5, 11, 17, 23, 29, 35 . . . 24 min |
|  | No. 6, 12, 18, 24, 30, 36 . . . 35 min |

TABLE 1

| Sample No. | Color | Appearance |
| --- | --- | --- |
| No. 1 | Gold | Black pearl combination of colors |
| No. 2 | Gold |  |
| No. 3 | Red gold |  |
| No. 4 | Blue gold |  |
| No. 5 | Yellow green | Slightly misty mirror face |
| No. 6 | Blue purple | Spherical monocrystal |

Figure 2A:
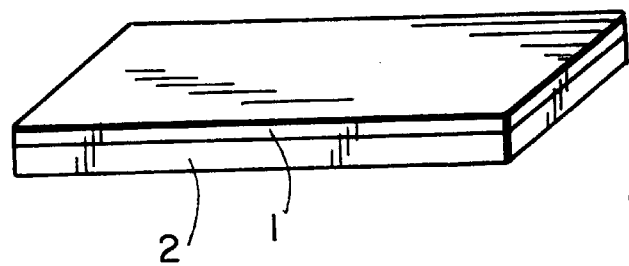
FIG. 2(a) is a perspective view of a plate-shaped silicon piece manufactured according to the present method.
Figure 2B:
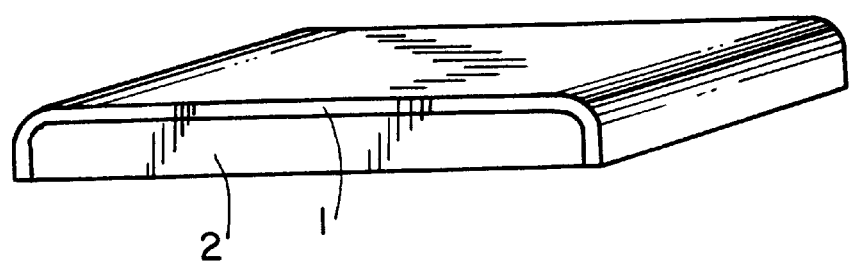
FIG. 2(b) is a perspective view of the profile where one angular portion of the two ends of a plate-shaped silicon piece is formed with "R"

FIG. 2(b) is a perspective view is a silicon piece example where one side angular portion of the two ends of a plate-shaped silicon piece is formed with "R", and said silicon piece was subject to a processing same as in FIG. 2(a). The results thereof are almost the same as in FIG. 2(a).

EXAMPLE 2

The second invention will be descrived with reference to an Example. This Example is characterized by the introduction of an NH cleansing process after the hydrofluoric acid treatment step. That is, a number of wafers of 5 mm thick were cut by slicer from a polycrystalline silicon ingot used for manufacturing semiconductors, and they were mirror polished. Then, these wafers were cut by cutter into 600 to 700 silicon plates of 50 mm×7 mm. After cleansing, they were immersed for 5 minutes in a 10 Wt % solution (70° C.) of hydrofluoric acid concentration at room temperature, washed with pure water and then dried. Further, said silicon plates were NH cleansed for 30 minutes with a solution (85° C.) of $NH_4$ OH: $H_2O_2$: $H_2O$ =10:7:83 (Wt %) whereafter the surface of the silicon plates was subject to a fine anisotropic slit etching processing. On the basis of the respective silicon plates as the starting material, which were subject to the above processings, ornamental silicon articles were manufactured by the following steps. The silicon plates were separated into 6 groups, each consisting of 100 plates, under the same oxidation filming conditions as in Example 1, and they were placed on a quartz boat. They were filmed by oxidation by oxdizing furnace in response to the respective periods of time for the oxidation processing shown in said Table A. The processing conditions are the same as in No. 7 to No. 12 excepting the time. As the result, there were obtained silicon plates having the colors shown in sample Nos. 7 to 12. These were ornamental silicon articles the appearance of which exhibited a mirror face elegance a little more misty than in Example 1. A sample of such article is shown in FIG. 2(a) where the reference numeral 1 designates a silicon oxidation film and 2 a silicon.

TABLE 2

| Sample No. | Color | Appearance |
| --- | --- | --- |
| No. 7 | Gold | Black pearl combination of colors |
| No. 8 | Gold |  |
| No. 9 | Red gold | A little thick misty mirror face |
| No. 10 | Blue gold | Polycrystalline mosaic |
| No. 11 | Yellow green | Plate-like |

EXAMPLE 3

Figure 3:
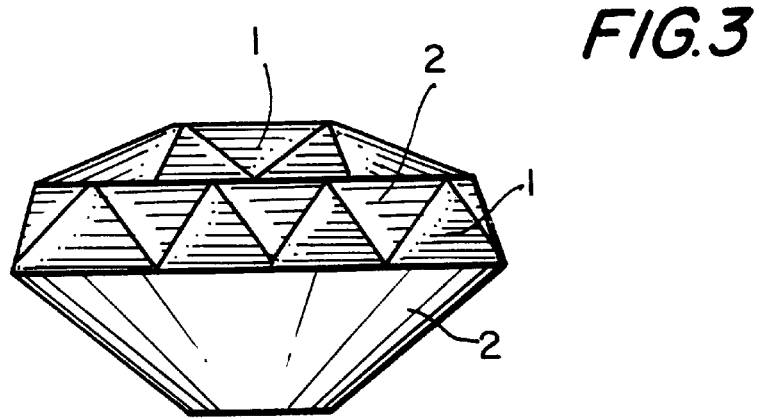
FIG. 3 is a side view of an ornamental silicon article where the present method is applied to a brilliant cut of diamond type.

The third invention will be described with reference to one Example. This Example is characterized by the introduction of a hydrofluoric acid processing step and an alkali etching step. That is, a number of wafers of 8 mm thick were cut by slicer from a polycrystalline silicon ingot used for manufacturing semiconductors and they were ground. Then, 600 to 700 column-like pieces having 10 mm diameter were rapped out of said wafers by using an ultrasonic wave vibration phon device to obtain diamond type mirror-cut pieces for jewel imitation. After cleansing, these cut pieces were immersed for 15 minutes in 10 Wt % solution of hydrofluoric acid at room temperature whereafter they were washed with pure water and dried. Further, they were subject to an alkali etching for 7 minutes with a solution (90° C.) of $KOH:H_2O$ =15:85 (Wt %), following to be washed with pure water and dried. An ornamental silicon article was made under the following steps based on each of the pieces as the starting material, which were processed as above. The cut pieces were separated into 6 groups, each consisting of 100 pieces, and each group of the pieces were placed on a quartz boat. To obtain desired oxidation film colors an oxidation filming was effected by oxidizing furnace. The processing conditions are the same as in Nos. 13 to 18 excepting the time. As the result, there were obtained pieces having colors as exhibited in sample Nos. 13 to 18 of Table 3, their appearance was cloudy in the fine slit form, and they could serve as ornamental silicon articles exhibiting an undulated, semi-lustrous elegance and having a polycrystalline mosaic pattern. To add, the polycrystal was treated with an alkali etching solution to effect an etching {the etching speed varies in the vertical direction and the horizontal direction, coarse and tight crystallizations exist depending on crystalizing direction so that the amount taken by the etching apparently differs, and therefore the etching speed is quick in coarse surface [(100) surfaces] while it delays in tight surfaces [(111) surfaces]; and since the respective crystal faces of the polycrystal are different in their respective facial directions and facial angles, the etching may have difference in speed thereby to produce stage differences whereby mosaic patterns are made clearly.} By this operation, the silicon surface after the oxidation filming to the final step exhibited gloss and shine in a sample. This sample is shown in FIG. 3 in which the reference number 1 shows a silicon oxidation film and 2 a silicon.

TABLE 3

| Sample No. | Color | Appearance |
| --- | --- | --- |
| No. 13 | Gold | Black pearl combination of colors |
| No. 14 | Gold | |
| No. 15 | Red gold | Cloudy in the fine slit form |
| No. 16 | Blue gold | Undulated semi-lustrous surface |
| No. 17 | Yellow green | Polycrystal mosaic |
| No. 18 | Blue purple | Diamond type cut |

EXAMPLE 4

The fourth invention will be described with reference to an Example. This Example is characterized by the introduction of an alkali etching step and an NH cleasing step. That is, 600–700 column-like pieces were obtained from a monocrystalline silicon material, they were cut into jewel-like diamond type pieces which are not mirror finished, said cuts were immersed for 120 minutes in a 55 Wt % hydrofluoric acid solution (10° C.) at room temperature, followed by cleansing with pure water and drying. Then, said cuts were subject to an alkali etching for 15 minuts by a solution (90° C.) of NaOH:H$_2$O =15:85 (Wt %) whereafter they were NH washed for 30 minutes by a solution (85° C.) of NH$_4$OH:H$_2$O$_2$:H$_2$O =10:7:83 (Wt %), followed by drying. Ornamental silicon articles were manufactured by taking the undermentioned steps based, as starting material, on the respective pieces thus processed. Said pieces were separated into 6 groups each consisting of 100 pieces, and they were placed on a quartz boat. To obtain desired oxidized film colors, they were filmed by oxidation by oxidizing furnace in response to the respective periods of time for oxidization processing illustrated in said Table A. The processing conditions are the same as in Nos. 19 to 24 excepting the time. As the result, there were obtained samples exhibiting colors shown in sample Nos. 19 to 24 of Table 4. Their surfaces were in the fine slit form in appearance, cloudy, had more undulation in surface than Example 3, and exhibited a semi-lustrous elegance. This sample is shown in FIG. 3 where the reference number 1 indicates an oxidized film and 2 a silicon.

TABLE 4

| Sample No. | Color | Appearance |
| --- | --- | --- |
| No. 19 | Gold | Black pearl combination of color |
| No. 20 | Gold | Cloudy |
| No. 21 | Red gold | Fine slit-like |
| No. 22 | Blue gold | Undulated surface |
| No. 23 | Yellow green | Semi-lustrous |
| No. 24 | Blue purple | Diamond type cut |

EXAMPLE 5

Figure 1B:
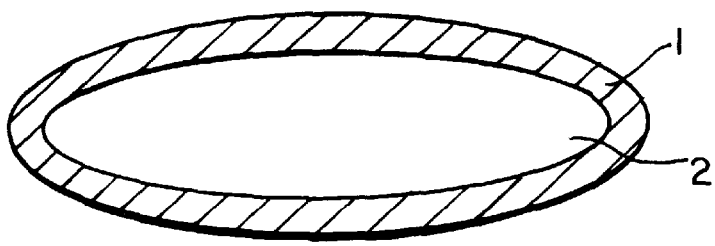
FIG. 1(b) is a sectional view of an oval silicon piece.

The fifth invention will be described with reference to one Example. This Example is characterized by the introduction of a hydrofluoric acid processing step and an alkali etching step with the use of the remaining polycrystalline material of the processing layers. That is, 100 wafers of 10 mm thick were sliced by slicer out of a polycrystalline silicon ingot used for making semiconductors, and 600 to 700 silicon pieces were cut in the rectangular form of 40 mm×20 mm from said wafers by using a cutter. These cut pieces were ground to make a starting material in the mirror-faced oval form, based on which ornamental silicon articles were obtained by the following steps. After the immersion of each of the oval silicon pieces into a 30 Wt % hydrofluoric acid solution (30° C.) for 30 minutes, it was cleaned with pure water and then dried. Subsequently, said pieces were subject to an alkali etching for 3 minuts by a solution (90° C.) of KOH:H$_2$O =25:75 (Wt %) whereafter they were cleaned with pure water and dried. Based on the starting material of the respective pieces thus processed the ornamental silicon articles were manufactured by the following steps. The silicon pieces were separated into 6 groups each having 100 pieces, and they were placed on a quartz boat. To obtain desired oxidized film colors, they were filmed by oxidation by oxidizing furnace in response to the respective periods of time for oxidization processing illustrated in said Table A. The processing conditions were the same as in Nos. 25 to 30 excepting the time. As the result, there were obtained samples exhibiting colors shown in sample Nos. 25 to 30 of Table 5. Their surfaces had polycrystalline patterns having gloss and shine a little on the surface. This sample is shown in FIG. 1(b) where the reference numeral 1 indicates a silicon oxidized film and 2 a silicon.

TABLE 5

| Sample No. | Color | Appearance |
| --- | --- | --- |
| No. 25 | Gold | Black pearl combination of colors |
| No. 26 | Gold | |
| No. 27 | Red gold | A little cloudy |
| No. 28 | Blue gold | A little lustrous |
| No. 29 | Yellow green | Oval-like polycrystalline pattern |
| No. 30 | Blue purple | Smooth and a crystal particle field is found |

EXAMPLE 6

The sixth Example will now be described with reference to one Example. This Example is characterized by introducing a hydrofluoric acid processing step and an alkali etching step by using the remaining monocrystalline material of the processing layers. That is, similarly to Example 5, 600 to 700 diamond type pieces were cut thereafter cleansing and drying them. Each of such cut pieces was immersed for 30 minutes into a 55 Wt % hydrofluoric acid solution (20° C.)

at room temperature whereafter it was cleansed with pure water and dried. Subsequently, said cut pieces were subject to an alkali etching for 15 minutes by a solution (90° C.) of KOH:$H_2O$=25:75 (Wt %) whereafter they were washed with pure water and dried. Based on the respective pieces thus processed as the starting material the ornamental silicon articles were manufactured by the following steps. The pieces were separated into 6 groups each having 100 pieces, and they were placed on a quartz boat. To obtain desired oxidized film colors, they were oxidation filmed by oxidizing furnace in response to the respective periods of time for oxidization processing illustrated in said Table A. The processing conditions were the same as in sample Nos. 31 to 36 excepting the time. As the result, there could be obtained samples exhibiting colors shown in sample Nos. 31 to 36 of Table 6. They exhibited a monocrystal whose appearance is more thickly cloudy than in Example 1 and of dull lustre. This sample is shown in FIG. 3 where the reference number 1 designates a silicon oxidized film and 2 a silicon.

TABLE 6

| Sample No. | Color | Appearance |
| --- | --- | --- |
| No. 31 | Gold | Black pearl combination of colors |
| No. 32 | Gold | |
| No. 33 | Red gold | Cloudy |
| No. 34 | Blue gold | Dull lustre |
| No. 35 | Yellow green | Monocrystal |
| No. 36 | Blue purple | Diamond type cut |

On the other hand, in the case of assumption that the hydrofluoric acid processing conditions differ in the processings of said Examples 1 to 6, a solution of thicker hydrofluoric acid concentration was used because of specifically delayed reaction of temperature at 10° C., when the surface was made coarse taking longer time while observing the silicon surface. Furthermore, in the case of thin hydrofluoric acid concentration, the temperature of the hydrofluoric acid solution was raised to accelerate the reaction whereby the time was adjusted while observing the silicon surface to allow the surface to be coarse.

The ordinary concentration of commercially available hydrofluoric acid is 50 to 55 Wt %, and such hydrofluoric acid is most easy for obtaining and handling. Though even 200 Wt % of the hydrofluoric acid concentration will be obtainable by special order, it practically becomes stronger in its smoke-generating property with the concentration higher than 56 Wt %, and it is likely to be gassified when transferred to a vessel with opening so that the concentration is not stabilized. Moreover, with the lapsing time after pouring into the vessel with opening the concentration fluctuates greatly, so that hydrofluoric acid of such concentration is unsuitable for mass production of ornamental silicon articles.

On the other hand, when diluted, if the hydrofluoric acid concentration is less than 10 Wt % the reaction becomes dull so as to cause an irregularity of reaction. Further, it takes a longer period of time to make the silicon surface uniformly coarse, and if the concentration is made thin the reaction does not takes place even if the temperature of the solution is raised resulting in impossible roughening of the silicon surface, so that hydrofluoric acid solution of such concentration is unsuitable for mass production of ornamental silicon articles.

However, the silicon surface can be roughed by making it coarse by raising the temperature of the solution in case the hydrofluoric acid is of low concentration or by lowering the temperature in case the hydrofluoric acid is of high concentration. In other way, it is possible to shorten the cleansing time if the solution is neutralized with acid (such as hydrochloric acid) after the alkali etching. The film thickness is minimally 0.2 μm (No. 1) and maximally 0.47 μm (No. 6). To add, the product whose oxidation film thickness is about 3 μm exhibits colors of ornamental properties. The oxidation film changes in color when it increases its thickness, but by forming a uniform oxidation film it is possible to obtain an identical color. However, to explain the present invention with reference to FIG. 8, the oxidation film thickness of silicon according to said respective Examples is even but virtual film thickness varies depending on the observation angle beasue of the plate surface, and the light to be reflected varies in color. This is because when the light reflects in the oxidation film and returns, the condition becomes the same as in case the thickness of the oxidation film has increased much more the silicon piece is seen slant.

If the base material is formed in a polygonal body, the virtual film thickness varies in the respective surfaces even with the oxidation film of even thickness, and therefore said body shines in various colors. Naturally, in case any surface is seen rectangular the body looks in original color.

Additionally, the filming by oxidation will practically be in the temperature range of 800 to 1,300° C.

EXAMPLE 7

Figure 5A:
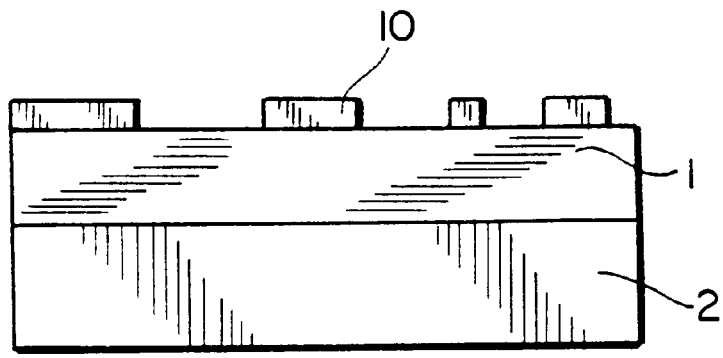
FIGS. 5(a) to 5(c) are sectional views of respective processes of different examples of ornamental silicon articles according to the present method.
Figure 5B:
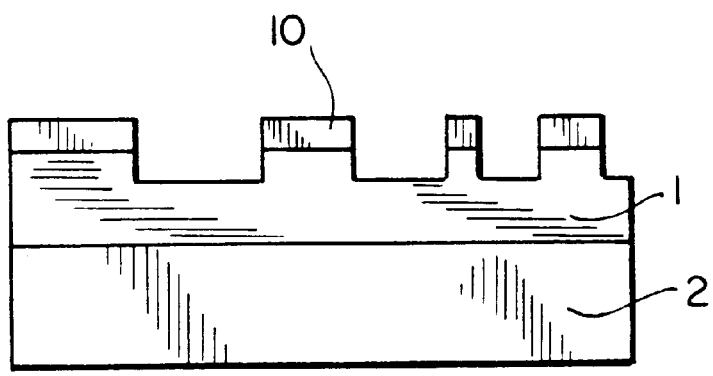
Figure 5C:
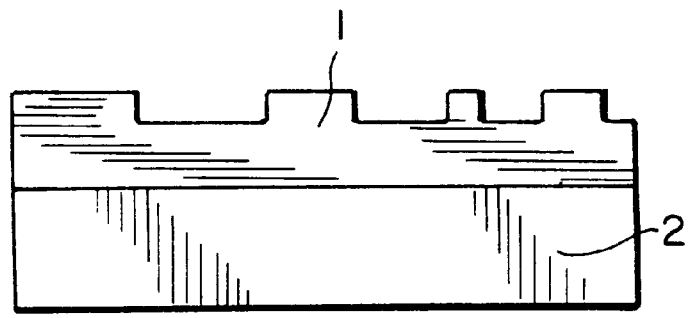

Similarly to Example 2, in respect of the silicon plates processed with oxidation filming, the oxidation film was partially etched by a certain depth by "resist-coating-make the window forming" method which is adopted usually at the manufacture of semiconductor elements thereby leaving a regular amount of the oxidation film. Then the resist was removed to obtain an ornamental silicon article in which the portions of different oxidized film thicknesses exsist in mixing. This operation is illustrated in FIG. 5(c). Because of partial difference of the film thickness the ornamental articles became to exhibit a variety of colors. Additionally, FIGS. 5(a) to 5(c) show in order the manufacturing steps of the ornamental silicon article in the present Example 7. The reference numeral 10 shows a photo-resist.

Figure 6A:
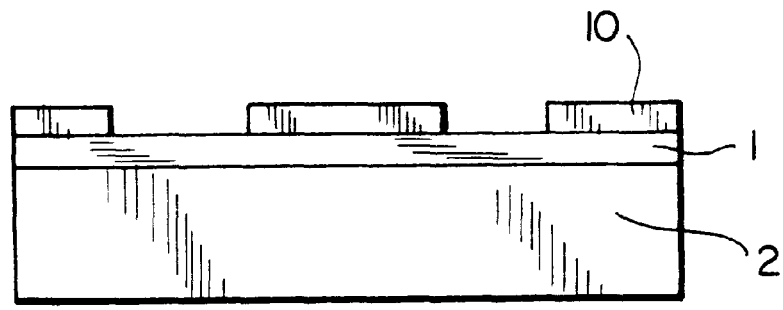
FIGS. 6(a) to 6(c) are sectional views of respective processes of further different examples of ornamental silicon articles according to the present method.
Figure 6B:
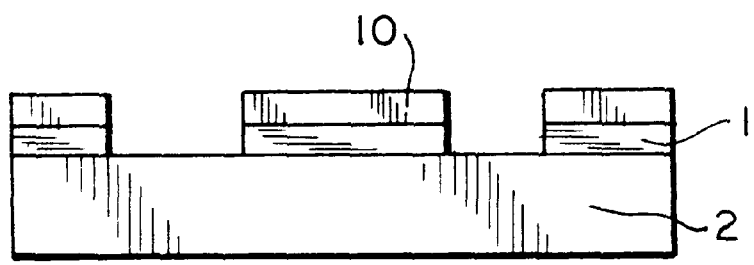
Figure 6C:
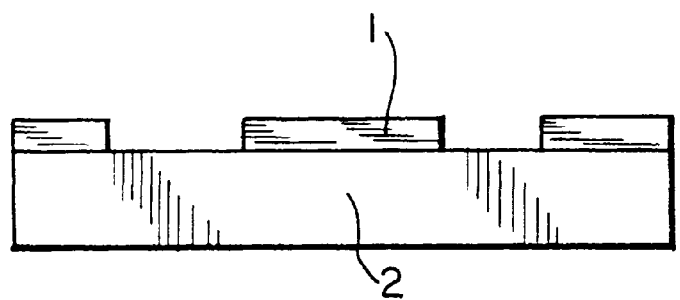

Further to add, the oxidation film of the window-formed portion remains with the state where an optional thickness is left, but as shown in FIG. 6(c), if it is thoroughly removed by etching it is capable of exposing the surface of the silicon itself, so that it is possible to obtain an ornamental silicon article such that a metallic lustre is mixed. Similarly to FIGS. 5(a) to 5(c), FIGS. 6(a) to 6(c) illustrate in order the manufacturing steps, too.

On the other hand, without relying upon the "resist-coating- make the window" method, the oxidation film can be partially removed by dropping suitably an etching agent such as HF upon the surface, spraying it or coating it by brush. In other way, it is also possible to partially grind the oxidation film by a grinding pat.

Figure 7A:
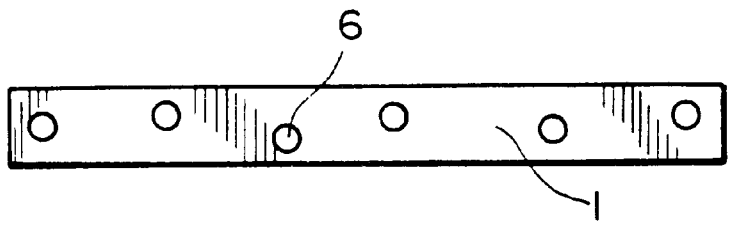
FIG. 7(a) to 7(c) are views illustrating applied examples of ornamental silicon articles manufactured according to the present method.
Figure 7B:
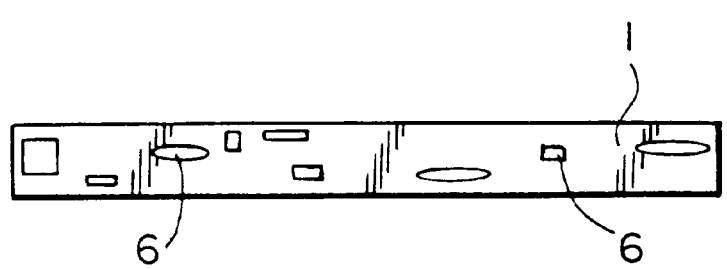
Figure 7C:
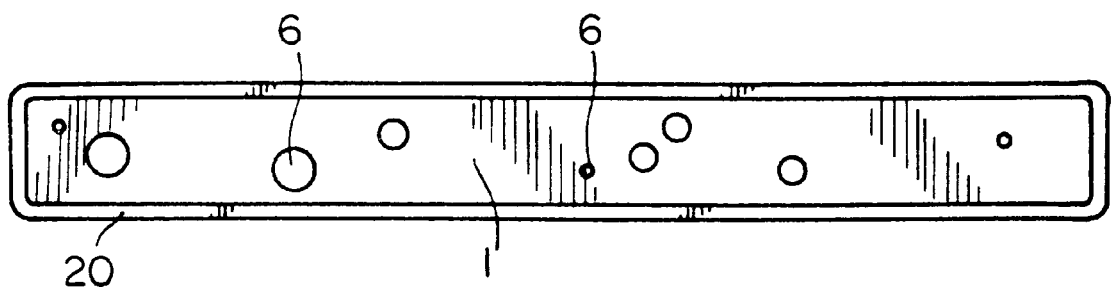

Moreover, in the window forming it is possible to produce, by using a mask, letters, numerals, symbols, picture symbols, block patterns, geometric devices and the like, and therefore it is capable of obtaining devised-out ornamental silicon articles having fashion and colorful properties. On example thereof is shown with the upper views of FIGS. 7(a) to 7(c).

Figure 9A:
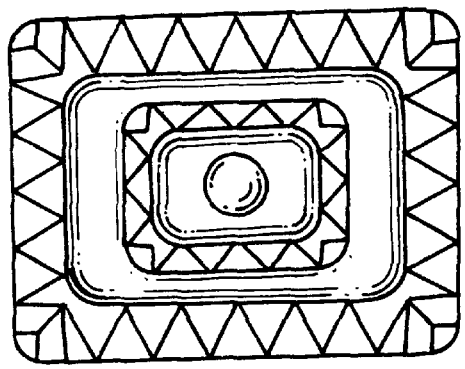
FIGS. 9(a) and 9(b) are respectively an upper surface view and a side view, illustrating an example of an ornamental silicon article having curved faces and cut portions.
Figure 9B:
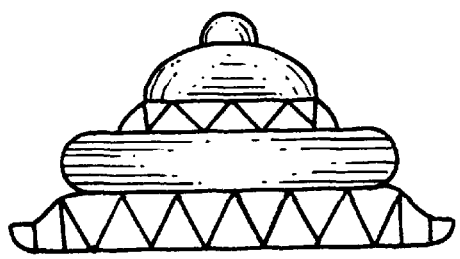

Further, as an applied example of the present invention, as shown in FIGS. 9(a) and 9(b), even ornamental silicon articles having curved faces and cut portions can be obtained. In FIG. 9, (a) is an upper surface view while (b)

is a side surface view. Thus, as the articles which exhibit mosaic patterns by using polycrystalline silicon base materials there can be mentioned, for example, wall materials or nameplates and doorplates, as well as ihai (Buddhist mortuary tablets) as specific article.

The ornamental articles obtained according the respective Examples of the invention are those obtained exclusively on the supposition that they are assembled like tiepins or necklaces. However, for example as figurines of animals, if the articles are filmed by oxidation after the silicon processing to the final shape, they becomes ornamental articles completed in themselves.

Due to the thin oxidation film of the surface the ornamental silicon articles of the invention the articles exhibit very beautiful appearances. Particularly, those having planes which are mirror processed exhibit an appearnce same as in black pearls which can be naturally obtained in southern islands to a small extent, or more beautiful than them. If such ornamental articles are supplied cheap in various shapes, the desire by ladies to beauty will be answered. For gentlemen, it will be possible to provide ornamental silicon articles such as necktie pins or cuff buttons which hide colorfulness, durability, novelty and applicability.

Since the oxidation film thickness can be controlled freely if the oxidizing conditions are properly chosen, it is possible in good reproductivity the ornamental silicon articles having desired gloss and shine. For example, even for the articles having cut faces, silicon has no processing problem so that it is capable of obtaining articles having the same profile and homogeneity of tiepins or the like thereby providing sufficiently worthy goods as ornamental articles. As pearls or the like, natural goods can hardly be processed in their free profiles, but in the ornamental silicon articles of the present invention the size and shape can be chosen freely and even processing can be freely effected, so that they can be applied to decorations and ornaments in various vields.

Furthermore, since the oxidation film of silicon is the same as so-called quartz it has a high hardness and excellent chemical-resistant and heat-resistant properties, so that the articles of the inventions has a durability much more that natural pearls or any other imitation articles. Pearls is deteriorated in quality by absorbing sweat in use over a longer period of time, but the ornamental silicon articles according to the present invention are stable. On the other hand, when specific gravity is observed, it is about 2.9 in pearls and 2.3 in silicon, so that people will have on feeling of heaviness even if worn. Further, since the oxidized film of silicon is inert it does not reversely affect human bodies like metallic allergy in recent question. Furthermore, though the present invention utilizes the interference function of light, which is caused by the oxidized film of silicon, it is possible to expect the same functional effect even by nitrogenated film. The nitrogenated film is harder than the oxidized film so as to be more stable, and therefore its utilization for serving as a protective film in particular is possible.

INDUSTRIAL FIELD OF THE INVENTION

According to the present invention, a monocrystalline or polycrystalline silicon body which is mirror finished or not mirror finished is processed by the method of the present invention to effect an oxidation filming thereby to obtain ornamental silicon articles having colorfulness, durability, novelty and applicability.

We claim:

1. A method for the manufacture of ornamental silicon articles from a starting material possessing a mirror-finished silicon surface which comprises the steps of:

(a) pre-processing the mirror-finished silicon surface by contacting it with a hydrofluoric acid solution of 10–55 Wt % concentration; and (b) heating the mirror-finished surface at an elevated temperature to form an oxidized film thereon.

2. A method according to claim 1, wherein the processing by said hydrofluoric acid solution is effected in the temperature range of 10° C. to 70° C.

3. A method according to claim 2, wherein the oxidized film is partially removed.

4. A method according to claim 3, wherein said silicon is either a polycrystalline material or a monocrystalline material.

5. A method for the manufacture of ornamental silicon articles from a starting material possessing a mirror-finished silicon surface, which comprise the steps of:

(a) pre-processing the mirror-finished silicon surface by contacting it with a solution of hydrofluoric acid solution of 10–55 Wt % concentration;

(b) cleaning the mirror-finished silicon surface with a compound which releases ammonia; and (c) heating the mirror-finished silicon surface at an elevated temperature to form an oxidized film thereon.

6. A method according to claim 5, wherein the processing by said hydrofluoric acid solution is effected in the temperature range of 10° C. to 70° C.

7. A method according to claim 6, wherein the oxidized film is partially removed.

8. A method according to claim 7, wherein said silicon is either a polycrystalline material or monocrystalline material.

9. A method for the manufacture of ornamental silicon articles from a starting material possessing a mirror-finished silicon surface, which comprises the steps of:

(a) pre-processing the mirror-finished silicon surface by contacting it with a solution of hydrofluoric acid of 10–55 Wt % concentration;

(b) etching the mirror-finished surface with an alkali; and (c) heating the alkali etched mirror-finished silicon surface at an elevated temperature to form an oxidized film thereon.

10. A method according to claim 9, wherein the processing by said hydrofluoric acid solution is effected in the temperature range of 10° C. to 70° C.

11. A method according to claim 10, wherein the oxidized film is partially removed.

12. A method according to claim 11, wherein said silicon is either a polycrystalline material or monocrystalline material.

13. A method for the manufacture of ornamental silicon from a starting material possessing a non-mirror finished silicon surface, which comprises the steps of:

(a) pre-processing the non-mirror-finished silicon surface by contacting it with a hydrofluoric acid solution of 10–55 Wt % concentration;

(b) etching the non-mirror-finished surface with an alkali; and (c) heating the alkali etched non-mirror-finished silicon surface at an elevated temperature to form an oxidized film thereon.

14. A method according to claim 13, wherein the processing by said hydrofluoric acid solution is effected in the temperature range of 10° C. to 70° C.

15. A method according to claim 14, wherein the oxidized film is partially removed.

16. A method according to claim 15, wherein said silicon is either a polycrystalline material or monocrystalline material.

17. A method for the manufacture of ornamental silicon from a starting material possessing a non-mirror-finished silicon surface, which comprise the steps of:

(a) pre-processing the non-mirror-finished silicon surface by contacting it with a hydrofluoric acid solution of 10–55 Wt % concentration;

(b) etching the non-mirror-finished surface with an alkali;

(c) cleaning the non-mirror-finished silicon surface with a compound which releases ammonia;

(d) heating the non-mirror-finished silicon surface at an elevated temperature to form an oxidized film thereon.

18. A method according to claim 17, wherein the processing by said hydrofluoric acid solution is effected in the temperature range of 10° C. to 70° C.

19. A method according to claim 18, wherein the oxidized film is partially removed.

20. A method according to claim 19, wherein said silicon is either a polycrystalline material or monocrystalline material.

* * * * *